United States Patent
Maruyama

(10) Patent No.: US 10,236,330 B2
(45) Date of Patent: Mar. 19, 2019

(54) DISPLAY DEVICE AND METHOD FOR MANUFACTURING THE SAME

(71) Applicant: Japan Display Inc., Minato-ku (JP)

(72) Inventor: Satoshi Maruyama, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/426,606

(22) Filed: Feb. 7, 2017

(65) Prior Publication Data

US 2017/0278916 A1    Sep. 28, 2017

(30) Foreign Application Priority Data

Mar. 23, 2016    (JP) .................................. 2016-058455

(51) Int. Cl.
*H01L 27/32*    (2006.01)
*H01L 27/12*    (2006.01)
(Continued)

(52) U.S. Cl.
CPC ...... *H01L 27/3262* (2013.01); *H01L 27/3265* (2013.01); *H01L 27/3276* (2013.01); *H01L 27/124* (2013.01); *H01L 27/1222* (2013.01); *H01L 27/1225* (2013.01); *H01L 27/1255* (2013.01); *H01L 27/1262* (2013.01);
(Continued)

(58) Field of Classification Search
CPC ............. H01L 27/3262; H01L 27/3265; H01L 27/3276; H01L 27/1222; H01L 27/1225; H01L 27/124; H01L 27/1255; H01L 27/1262; H01L 29/66757; H01L 29/66969;
(Continued)

(56) References Cited

U.S. PATENT DOCUMENTS

2002/0140643 A1    10/2002    Sato
2006/0145162 A1    7/2006    Yang
(Continued)

FOREIGN PATENT DOCUMENTS

JP    2012-160679    8/2012
KR    10-2015-0101410    9/2015

OTHER PUBLICATIONS

Office Action dated Mar. 27, 2018 in Taiwanese Patent Application No. 106103053.
(Continued)

*Primary Examiner* — Cheung Lee
*Assistant Examiner* — Stephen C Smith
(74) *Attorney, Agent, or Firm* — Oblon, McClelland, Maier & Neustadt, L.L.P.

(57) ABSTRACT

A plurality of thin film transistors provided in a peripheral region are first staggered thin film transistors where a first channel layer configured of low-temperature polysilicon is included, and the first channel layer is not interposed between a first source electrode and a first gate electrode, and between a first drain electrode and the first gate electrode. A plurality of thin film transistors provided in a display region are second staggered thin film transistors where a second channel layer configured of an oxide semiconductor is included, and the second channel layer is not interposed between a second source electrode and a second gate electrode, and between a second drain electrode and the second gate electrode. The first thin film transistor is located below the second thin film transistor.

12 Claims, 7 Drawing Sheets

(51) Int. Cl.
*H01L 29/66* (2006.01)
*H01L 29/786* (2006.01)

(52) U.S. Cl.
CPC .. *H01L 29/66757* (2013.01); *H01L 29/66969* (2013.01); *H01L 29/7869* (2013.01); *H01L 29/78675* (2013.01); *H01L 2227/323* (2013.01)

(58) Field of Classification Search
CPC ........... H01L 29/78675; H01L 29/7869; H01L 2227/323
See application file for complete search history.

(56) References Cited

U.S. PATENT DOCUMENTS

| | | |
|---|---|---|
| 2009/0078939 A1 | 3/2009 | Yamazaki et al. |
| 2013/0193433 A1 | 8/2013 | Yamazaki |
| 2014/0102877 A1* | 4/2014 | Yamazaki ............. C30B 23/005 204/192.15 |
| 2015/0053955 A1 | 2/2015 | Furuie et al. |
| 2015/0206929 A1 | 7/2015 | Sato |
| 2015/0243220 A1* | 8/2015 | Kim ..................... H01L 27/1225 345/215 |
| 2016/0064421 A1* | 3/2016 | Oh ....................... H01L 27/1222 257/43 |
| 2016/0064465 A1* | 3/2016 | Oh ....................... H01L 27/3262 257/43 |
| 2016/0372497 A1* | 12/2016 | Lee ..................... H01L 27/1255 |
| 2017/0092178 A1* | 3/2017 | Lee ..................... H01L 27/1225 |

OTHER PUBLICATIONS

Office Action issued in Taiwanese Patent Application No. 106103053 dated Jul. 9, 2018, with English Translation, 10 pages.
Office Action dated Oct. 31, 2018, in Korean Patent Application No. 10-2017-0016128, with Computer-generated English Translation.

* cited by examiner

DISPLAY DEVICE AND METHOD FOR MANUFACTURING THE SAME

CROSS-REFERENCE TO RELATED APPLICATION

The present application claims priority from Japanese application JP2016-058455 filed on Mar. 23, 2016, the content of which is hereby incorporated by reference into this application.

BACKGROUND OF THE INVENTION

1. Field of the Invention

The present invention relates to a display device and a method for manufacturing the same.

2. Description of the Related Art

A display device displays an image by emitting light with luminance and chromaticity responding to each pixel. For example, the light is emitted by flowing a current through an organic light-emitting layer provided between a plurality of pixel electrodes which are arranged in a matrix shape and a common electrode which is common to the pixel electrodes. In each of the pixels, a pixel circuit where a plurality of thin film transistors are combined with a capacitor is laid out.

The thin film transistor configured of low-temperature polysilicon is frequently used since drive performance thereof is high. The silicon is polycrystallized by excimer laser annealing, but shot variation of the laser becomes large, and it is not possible to reduce current variation of each pixel. Therefore, there is a need to provide a correction circuit, or to repeat irradiation by irradiating the silicon with the laser several times, and there are problems such as high cost of a device and a material of the laser.

In recent years, as a thin film transistor process, a process for manufacturing the thin film transistor by using an oxide semiconductor has been developed (JP 2012-160679 A). However, it is not possible to satisfy limit conditions such as a narrow frame and low power consumption with the current thin film transistor using the oxide semiconductor. Therefore, development of a process for mixing the thin film transistor configured of the oxide semiconductor and the thin film transistor configured of the low-temperature polysilicon is asked.

SUMMARY OF THE INVENTION

An object of the present invention is to decrease current variation of a thin film transistor, and to increase drive performance.

According to an aspect of the present invention, there is provided a display device including a plurality of pixel electrodes that are provided in a display region for displaying an image, a common electrode that is disposed above the plurality of pixel electrodes, a light-emitting element layer that is interposed between the plurality of pixel electrodes and the common electrode, and a circuit layer that is configured of a plurality of layers reaching to a peripheral region which is an outside of the display region from the display region, in which the circuit layer includes a plurality of thin film transistors in each of the display region and the peripheral region, the plurality of thin film transistors provided in the peripheral region are first staggered thin film transistors where a first channel layer configured of low-temperature polysilicon is included, and the first channel layer is not interposed between a first source electrode and a first gate electrode, and between a first drain electrode and the first gate electrode, the plurality of thin film transistors provided in the display region are second staggered thin film transistors where a second channel layer configured of an oxide semiconductor is included, and the second channel layer is not interposed between a second source electrode and a second gate electrode, and between a second drain electrode and the second gate electrode, and the second thin film transistor located above the first thin film transistor.

According to the aspect of the present invention, since the first thin film transistor and the second thin film transistor are the staggered thin film transistors, parasitic capacitance becomes small, and drive performance is high. Since the second channel layer of the second thin film transistor is configured of the oxide semiconductor, it is possible to decrease current variation. The first thin film transistor is located below the second thin film transistor. Therefore, since the second thin film transistor is formed after the first thin film transistor, the second thin film transistor is not affected by heat at the time of forming the first channel layer configured of the low-temperature polysilicon.

According to another aspect of the present invention, there is provided a method for manufacturing a display device including a display region for displaying an image and a peripheral region which is an outside of the display region, the method including forming a first staggered thin film transistor where a first channel layer configured of low-temperature polysilicon is included, and the first channel layer is not interposed between a first source electrode and a first gate electrode, and between a first drain electrode and the first gate electrode, in the peripheral region, forming a second staggered thin film transistor where a second channel layer configured of an oxide semiconductor is included, and the second channel layer is not interposed between a second source electrode and a second gate electrode, and between a second drain electrode and the second gate electrode, in the display region, after forming the first thin film transistor, forming a plurality of pixel electrodes in the display region, after forming the second thin film transistor, forming a light-emitting element layer on the plurality of pixel electrodes, and forming a common electrode on the light-emitting element layer.

According to another aspect of the present invention, since the first thin film transistor and the second thin film transistor are the staggered thin film transistors, the parasitic capacitance becomes small, and the drive performance is high. Since the second channel layer of the second thin film transistor is formed of the oxide semiconductor, it is possible to decrease the current variation. Furthermore, since the second thin film transistor is formed after the first thin film transistor, the second thin film transistor is not affected by the heat at the time of forming the first channel layer configured of the low-temperature polysilicon.

DETAILED DESCRIPTION OF THE INVENTION

Hereinafter, embodiments of the present invention will be described with reference to the drawings.

First Embodiment

Figure 1:
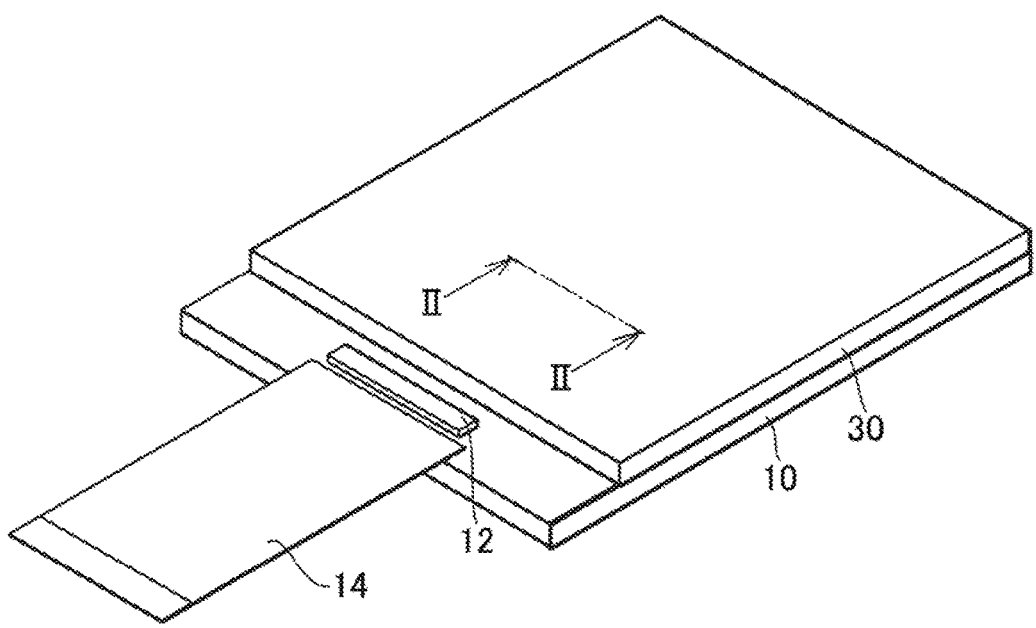
FIG. 1 is a perspective view of a display device according to a first embodiment of the present invention.

FIG. 1 is a perspective view of a display device according to a first embodiment of the present invention. As a display device, an organ electroluminescence display device is used as an example. For example, the display device combines unit pixels (sub-pixels) of a plurality of colors which are configured of red, green and blue with each other, forms a full-color pixel (pixel), and displays a full-color image. For example, the display device includes a first substrate 10 having flexibility by being configured of a resin. An integrated circuit chip 12 that drives an element for displaying the image is installed in the first substrate 10, and a flexible printed board 14 for electrical connection to the outside is connected, to the first substrate 10.

Figure 2:
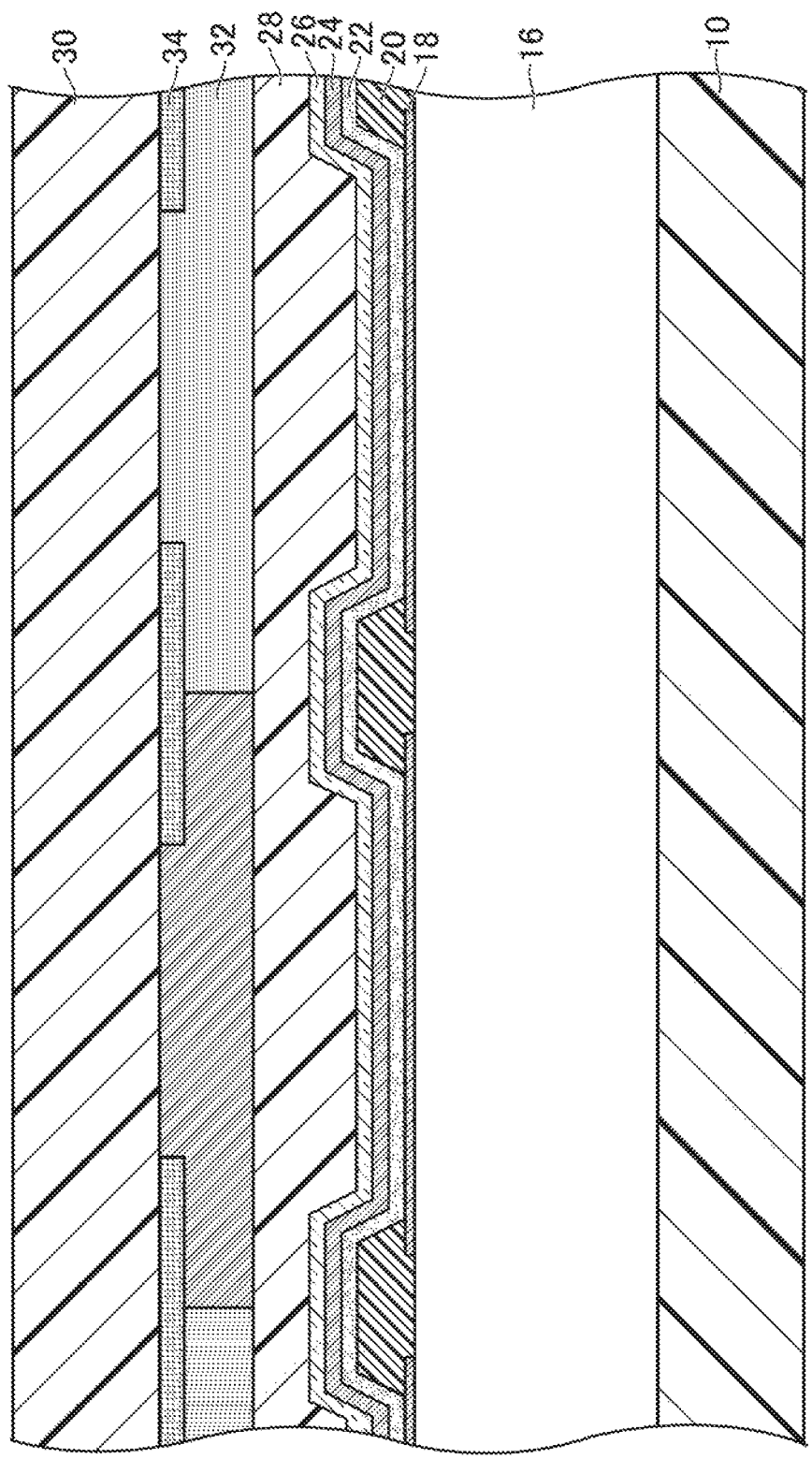
FIG. 2 is a sectional view which is taken along II-II line of the display device illustrated in FIG. 1.

FIG. 2 is a sectional view which is taken along II-II line of the display device illustrated in FIG. 1. A circuit layer 16 is stacked on the first substrate 10. Details of the circuit layer 16 will be described later. On the circuit layer 16, a plurality of pixel electrodes 18 (for example, anodes) configured to respond to each of the plurality of unit pixels are provided. An insulating layer 20 is formed on the circuit layer 16 and the pixel electrode 18. The insulating layer 20 is positioned on a peripheral portion of the pixel electrode 18, and is formed so as to open a portion (for example, central portion) of the pixel electrode 18. By the insulating layer 20, a bank that surrounds the portion of the pixel electrode 18 is formed.

A light-emitting element layer 22 is provided on the pixel electrode 18. The light-emitting element layer 22 is continuously positioned on the plurality of pixel electrodes 18, and is also positioned on the insulating layer 20. As a modification example, the light-emitting element layer 22 may be separately (dividedly) provided per pixel electrode 18. The light-emitting element layer 22 may include at least a light-emitting layer, and may further include at least one layer of an electron transport layer, a hole transport layer, an electron injection layer, and a hole injection layer.

On the light-emitting element layer 22, a common electrode 24 (for example, cathode) is provided so as to be in contact with the light-emitting element layer 22 above the plurality of pixel electrodes 18. The common electrode 24 is formed so as to be positioned on the insulating layer 20 serving as a bank. The light-emitting element layer 22 is interposed between the pixel electrode 18 and the common electrode 24, and luminance is controlled by a current flowing therebetween, and thereby, the light-emitting element layer 22 emits the light. The light-emitting element layer 22 is sealed by being covered with a sealing layer 26 that is stacked on the common electrode 24, and is blocked from moisture. Above the sealing layer 26, a second substrate 30 is provided through a filling layer 28. In the second substrate 30, colored layers 32 that are configured of the plurality of colors (for example, blue, red and green) are provided, and a black matrix 34 is formed of a metal, a resin or the like between the colored layers 32 of the colors which are different from each other, and a color filter is configured. The second substrate 30 may be a touch panel, or may include a polarizing plate or a phase difference plate.

Figure 3:
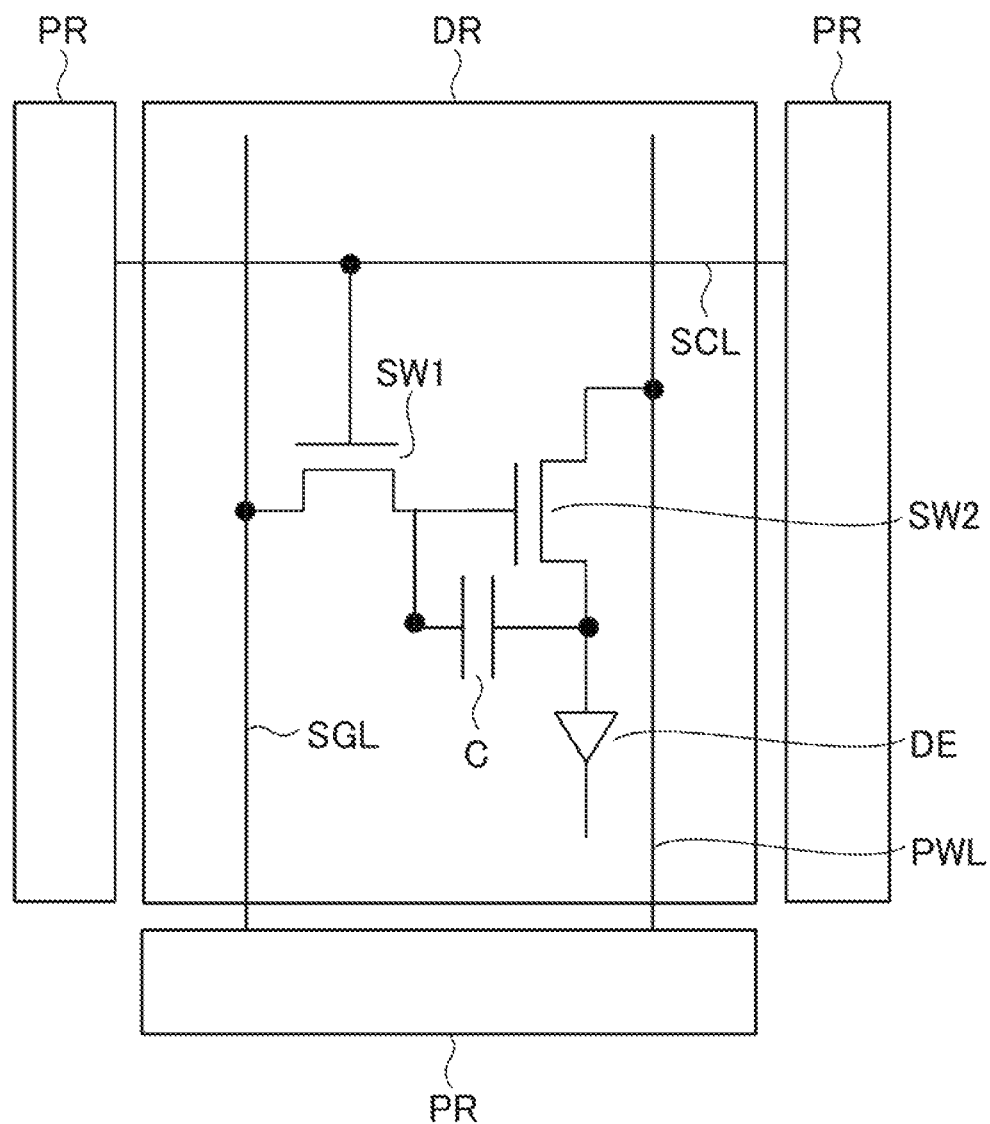
FIG. 3 is a circuit diagram of the display device according to the first embodiment of the present invention.

FIG. 3 is a circuit diagram of the display device according to the first embodiment of the present invention. The display device includes a display region DR for displaying the image. In the display region DR, a display element DE is provided per pixel. The display element DE is configured of the pixel electrode 18, the common electrode 24, and the light-emitting element layer 22 interposed therebetween which are illustrated in FIG. 2. The display element DE emits the light by the current which is supplied from a power supply line PWL. At the time of emitting the light, the luminance is adjusted depending on a video signal which is written in a capacitor C. The video signal is supplied from a signal line SGL, and is written by a first switching element SW1. A control of the first switching element SW1 is performed depending on a scanning signal which is input from a scanning line SCL. A second switching element SW2 controls the current flowing through the display element DE depending on the video signal which is written in the capacitor C. A peripheral region PR is in the vicinity of the display region DR. In the peripheral region PR, a drive circuit that generates the scanning signal, the video signal and the like is provided.

Figure 4:
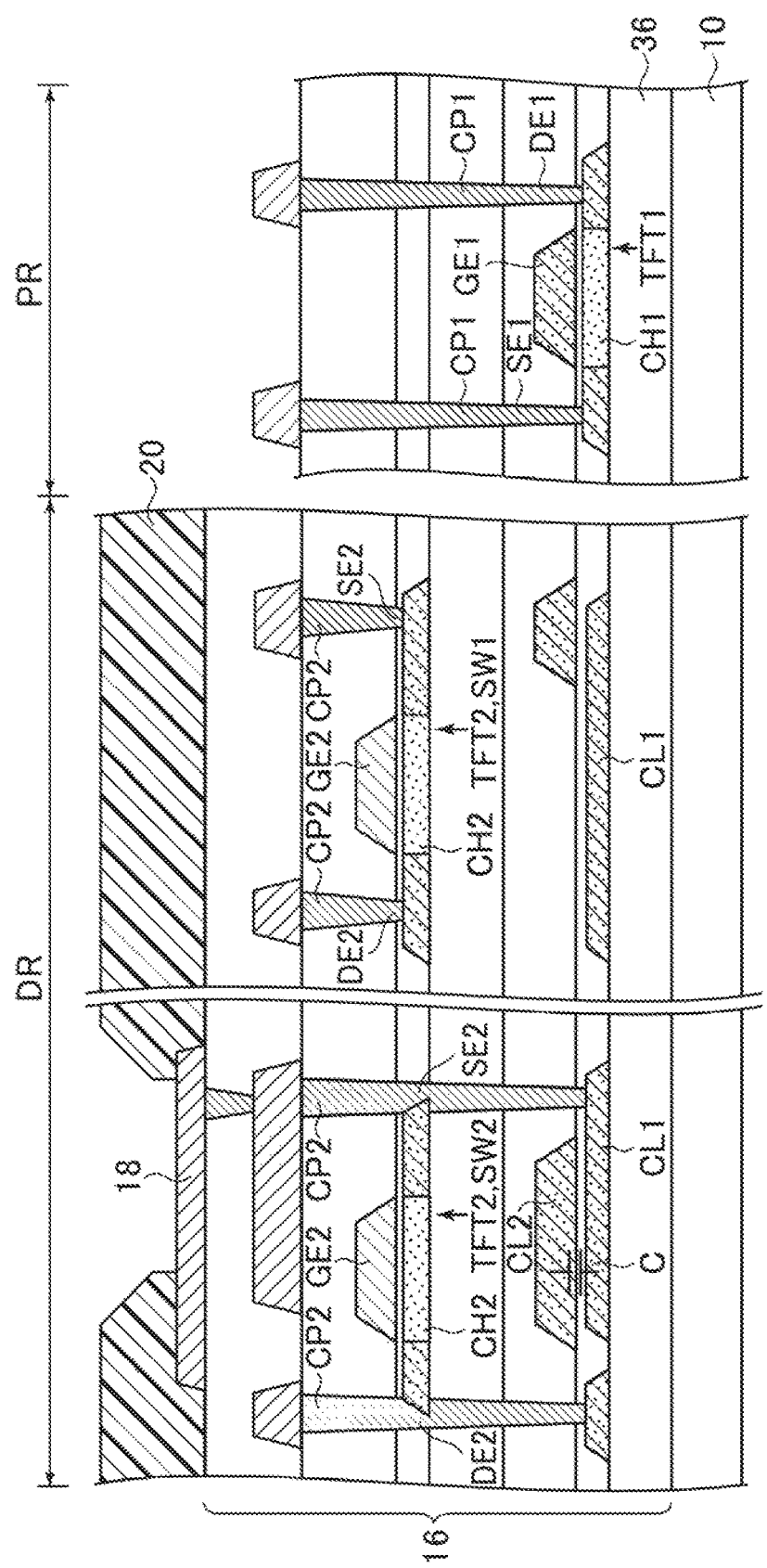
FIG. 4 is an outline diagram illustrating details of a circuit layer in the first embodiment.

FIG. 4 is an outline diagram illustrating details of the circuit layer 16 in the first embodiment. The circuit layer 16 is at the display region DR and the peripheral region PR which is an outside of the display region DR. In the first substrate 10, a barrier film 36 is formed so as to protect the display device from impurities which are contained in the first substrate 10 itself.

The circuit layer 16 includes a plurality of thin film transistors in the peripheral region PR. The plurality of thin film transistors provided in the peripheral region PR are first thin film transistors TFT1 including a first channel layer CH1 which is configured of low-temperature polysilicon. The first thin film transistor TFT1 is included in the drive circuit that is formed in the peripheral region PR illustrated in FIG. 3. The first thin film transistor TFT1 is a staggered thin film transistor. Therefore, since the first channel layer CH1 is not interposed between a first source electrode SE1 and a first gate electrode GE1, and between a first drain electrode DE1 and the first gate electrode GE1, parasitic capacitance becomes small, and drive performance is high. The first channel layer CH1 includes a portion protruding from a portion which overlaps the first gate electrode GE1, and a resistance value of the portion is lowered by injection of ions. Furthermore, a first contact plug CP1 is provided. The first contact plug CP1 penetrates upper insulating layers (plurality of layers) in comparison with the first thin film transistor TFT1 of the circuit layer 16, and is connected to the portion of the first channel layer CH1 protruding from the portion which overlaps the first gate electrode GE1).

In the display region DR, the plurality of pixel electrodes 18 are provided. As described above with reference to FIG. 2, the insulating layer 20 is positioned on the pixel electrode 18. Other members provided on the pixel electrode 18 are omitted in FIG. 4. The circuit layer 16 includes a plurality of thin film transistors in the display region DR. The plurality of thin film transistors provided in the display region DR are second thin film transistors TFT2 including a second channel layer CH2 which is configured of an oxide semiconductor. Since the second channel layer CH2 of the second thin film transistor TFT2 is configured of the oxide semiconductor, it is possible to decrease current variation. Moreover, the second thin film transistor TFT2 is a staggered thin film transistor. Therefore, since the second channel layer CH2 is not interposed between a second source electrode SE2 and a second gate electrode GE2, and between a second drain electrode DE2 and the second gate electrode GE2, the parasitic capacitance becomes small, and the drive performance is high. The second channel layer CH2 includes a portion protruding from a portion which overlaps the second gate electrode GE2, and the resistance value of the portion is lowered by the injection of the ions.

The second thin film transistor TFT2 is located above the first thin film transistor TFT1. Therefore, since the second thin film transistor TFT2 is formed after the first thin film transistor TFT1, the second thin film transistor TFT2 is not affected by heat at the time of forming the first channel layer CH1 configured of the low-temperature polysilicon.

The first switching element SW1 and the second switching element SW2 illustrated in FIG. 3 are respectively the second thin film transistors TFT2 illustrated in FIG. 4. The second thin film transistor TFT2 serving as the second switching element SW2 is connected so as to control a supply amount of the current to each of the plurality of pixel electrodes 18. Moreover, a second contact plug CP2 is provided. The second contact plug CP2 penetrates the upper insulating layer in comparison with the second thin film transistor TFT2 of the circuit layer 16, and is connected to the portion of the second channel layer CH2 (protruding from the portion which overlaps the second gate electrode GE2).

The plurality of layers configuring the circuit layer 16 include a first conductive layer CL1 that is formed by injecting the ions into the low-temperature polysilicon layer in the display region DR. The first conductive layer CL1 is positioned at the same layer as the first channel layer CH1 of the first thin film transistor TFT1, and is located below the second thin film transistor TFT2. The first conductive layer CL1 has a size overlapping a whole of the second thin film transistor TFT2, and thereby, it is possible to protect the second thin film transistor TFT2 from heat or static electricity. In the example of FIG. 4, the second contact plug CP2 is provided so as to expose an end portion of the second channel layer CH2, and furthermore, to reach to the first conductive layer CL1.

The plurality of layers configuring the circuit layer 16 further include, in the display region DR, the first conductive layer CL1 is used as one electrode of the capacitor C and a second conductive layer CL2 that is used as the other electrode at an opposite position to the first conductive layer CL1. The second conductive layer CL2 is positioned at the same layer as the first gate electrode GE1 of the first thin film transistor TFT1, and is located below the second thin film transistor TFT2. Since the capacitor C is provided so as to overlap the second thin film transistor TFT2, a flat space is not needed.

In a method for manufacturing the display device according to the first embodiment, the first thin film transistor TFT1 described above is formed in the peripheral region PR. In the process, at the same time, in the display region DR, the first conductive layer CL1 is formed by forming the low-temperature polysilicon layer and injecting the ions into the low-temperature polysilicon layer. The first conductive layer CL1 may be formed so as to have the size overlapping the whole of the second thin film transistor TFT2. In the process, the second conductive layer CL2 that is used as an electrode for forming the capacitor C along with the first conductive layer CL1 is formed, at the same time as the forming of the first gate electrode GE1.

After the first thin film transistor TFT1 is formed, the second thin film transistor TFT2 described above is formed in the display region DR. Since the second thin film transistor TFT2 is formed after the first thin film transistor TFT1, the second thin film transistor TFT2 is not affected by the heat at the time of forming the first channel layer CH1 configured of the low-temperature polysilicon. After the second thin film transistor TFT2 is formed, the plurality of pixel electrodes 18 are formed in the display region DR. As illustrated in FIG. 2, the light-emitting element layer 22 is formed on the plurality 28 of pixel electrodes 18, and the common electrode 24 is formed on the light-emitting element layer 22.

Modification Example

Figure 5:
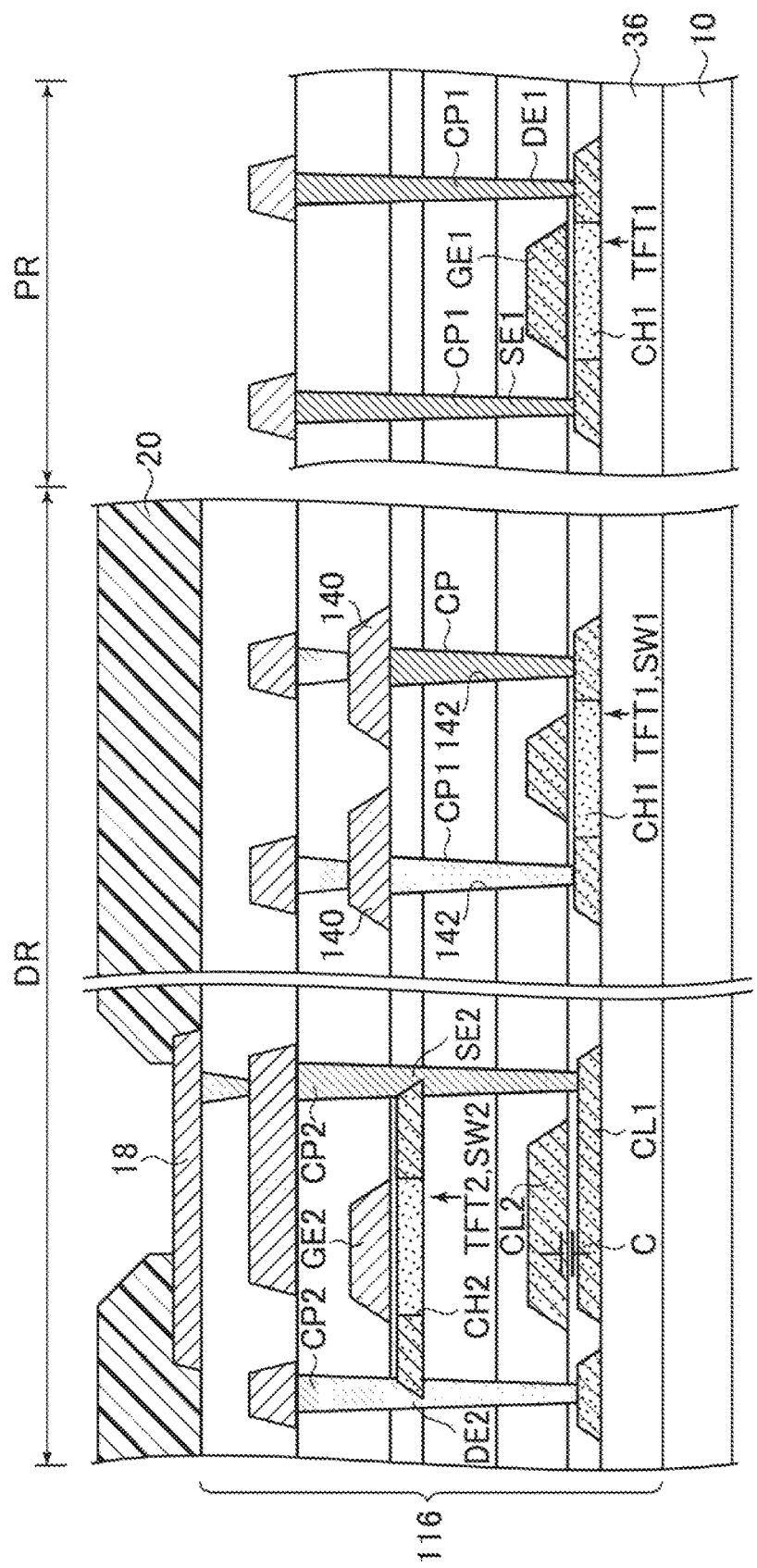
FIG. 5 is a diagram illustrating a modification example of the first embodiment.

FIG. 5 is a diagram illustrating a modification example of the first embodiment. In the modification example, the plurality of thin film transistors provided in the display region DR include the first thin film transistor TFT1 at a position of the same layer as the first thin film transistor TFT1 of the peripheral region PR. That is, the first switching element SW1 illustrated in FIG. 3 is the first thin film transistor TFT1. The first contact plug CP1 that penetrates the upper insulating layer in comparison with the first thin film transistor TFT1 of a circuit layer 116, and is connected to the first channel layer CH1, is provided.

The plurality of layers configuring the circuit layer 116 include a metal layer 140 that is formed of the same material at a position of the same layer as the second gate electrode GE2 of the second thin film transistor TFT2 so as to overlap at least an end portion of the first channel layer CH1 of the first thin film transistor TFT1. The metal layer 140 is formed so as to be integrated with the first contact plug CP1.

As described above, the second channel layer CH2 includes the portion protruding from a portion which overlaps the second gate electrode GE2. Since the second gate electrode GE2 is used as a mask and the ions are injected, the resistance value is lowered in the portion. By providing the metal layer 140, it is possible to prevent characteristic deterioration of the first thin film transistor TFT1 due to the process for injecting the ions.

In a method for manufacturing the display device according to the modification example, a point in which the first thin film transistor TFT1 is also formed in the display region DR in the process for forming the first thin film transistor TFT1 in the peripheral region PR, is different from that of the above embodiment.

In the display region DR, the second thin film transistor TFT2 is formed. Before the second gate electrode GE2 is formed, a through-hole 142 reaching to an upper surface of the first channel layer CH1 from the insulating layer below the second gate electrode GE2 is formed. At the same time as the forming of the second gate electrode GE2, the first contact plug CP1 is formed within the through-hole 142, and the metal layer 140 is formed. The metal layer 140 is formed so as to overlap at least the end portion of the first channel layer CH1 of the first thin film transistor TFT1 by being integrated with the first contact plug CP1.

Second Embodiment

Figure 6:
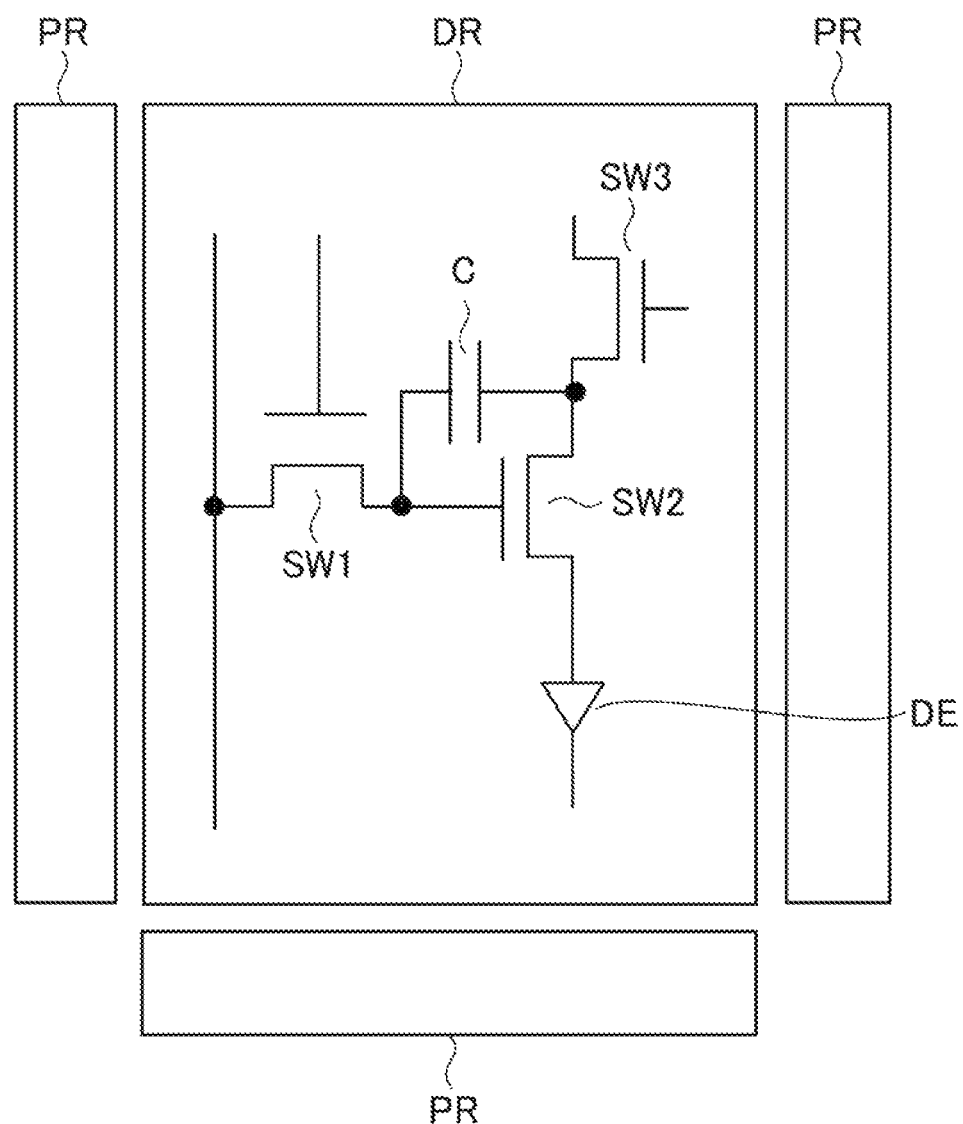
FIG. 6 is a circuit diagram of a display device according to a second embodiment of the present invention.

FIG. 6 is a circuit diagram of a display device according to a second embodiment of the present invention. In the embodiment, the video signal is written in the capacitor C by the first switching element SW1, the current flowing through the display element DE is controlled by the second switching element SW2, and a current supply is switched between an ON state and an OFF state by a third switching element SW3.

Figure 7:
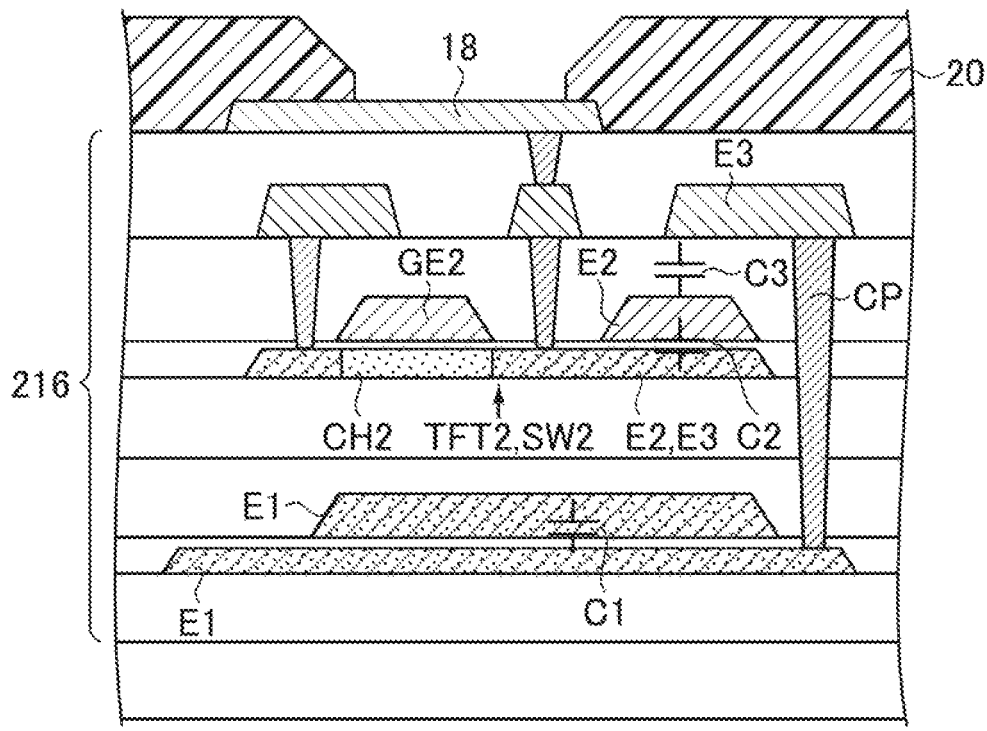
FIG. 7 is an outline diagram illustrating details of a circuit layer in the second embodiment.

FIG. 7 is an outline diagram illustrating details of a circuit layer 216 in the second embodiment. In the embodiment, the capacitor C illustrated in FIG. 6 is configured of a plurality of capacitors (first capacitor C1, second capacitor C2 and third capacitor C3) which are connected to each other in series.

The first capacitor C1 includes a pair of electrodes E1 that is formed by injecting the ions into the low-temperature polysilicon layer. The pair of electrodes E1 is configured of the same material at the same layer as the first channel layer CH1 and the first gate electrode GE1 of the first thin film transistor TFT1 (see FIG. 4) which are formed in the peripheral region PR.

A pair of electrodes E2 of the second capacitor C2 is configured of an electrode that is formed of a portion (portion protruding from the portion which overlaps the second gate electrode GE2, and where the resistance value is lowered) of the second channel layer CH2 of the second thin film transistor TFT2 serving as the second switching element SW2, and an electrode (of the same material at the same layer as the second gate electrode GE2) which is formed above the electrode.

A pair of electrodes E3 of the third capacitor C3 is configured of one electrode E2 of the second capacitor C2, and an electrode which is formed above the electrode E2. The second capacitor C2 and the third capacitor C3 are connected to each other in series by sharing one electrode. An electrode E1 of the first capacitor C1 is connected to the other electrode which is not shared with the second capacitor C2 or the third capacitor C3, by a contact plug CP. Other details thereof are equivalent to the content described in the first embodiment. In a method for manufacturing the display device according to the second embodiment, the pair of electrodes E3 of the third capacitor C3 is formed at the same time as the time of forming the first thin film transistor TFT1 (see FIG. 4) in the peripheral region PR. When the second thin film transistor TFT2 is formed, the pair of electrodes E2 (one electrode E3 of the third capacitor C3) of the second capacitor C2 is formed. Thereafter, the other electrode E3 of the third capacitor C3 is formed.

The display device is not limited to the organic electroluminescence display device, and may be a display device in which a light-emitting element such as a quantum dot light-emitting element (QLED: Quantum-Dot Light Emitting Diode) is included in each pixel, or may be a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a plurality of pixel electrodes that are provided in a display region for displaying an image;
   a common electrode that is disposed above the plurality of pixel electrodes;
   a light-emitting element layer that is interposed between the plurality of pixel electrodes and the common electrode; and
   a circuit layer that is configured of a plurality of layers reaching to a peripheral region which is an outside of the display region from the display region,
   wherein the circuit layer includes a plurality of thin film transistors in each of the display region and the peripheral region,
   the plurality of thin film transistors provided in the peripheral region are first staggered thin film transistors where a first channel layer configured of low-temperature polysilicon is included, and the first channel layer is not interposed between a first source electrode and a first gate electrode, and between a first drain electrode and the first gate electrode,
   the first source electrode is connected with a first contact plug,
   the first drain electrode is connected with a second contact plug,
   the plurality of thin film transistors provided in the display region are second staggered thin film transistors where a second channel layer configured of an oxide semiconductor is included, and the second channel layer is not interposed between a second source electrode and a second gate electrode, and between a second drain electrode and the second gate electrode,
   the second staggered thin film transistor is positioned at a higher layer in comparison with the first staggered thin film transistor,
   the first contact plug passes through a layer in which the second channel layer is disposed,
   the plurality of layers configuring the circuit layer further include a metal layer that is formed of the same material at a position of the same layer as the second gate electrode of the second staggered thin film transistor to overlap at least an end portion of the first channel layer of the first staggered thin film transistor, and
   the metal layer is formed to be integrated with the first contact plug.

2. The display device according to claim 1, wherein the second staggered thin film transistor provided in the display region is connected to control a supply amount of a current to each of the plurality of pixel electrodes.

3. The display device according to claim 1, wherein the plurality of layers configuring the circuit layer include a conductive layer that is formed by injecting ions into the low-temperature polysilicon layer in the display region, and
   the conductive layer is positioned at the same layer as the first channel layer of the first staggered thin film transistor, and is positioned at a lower layer in comparison with the second staggered thin film transistor.

4. The display device according to claim 3, wherein the conductive layer has a size overlapping a whole of the second staggered thin film transistor.

5. The display device according to claim 3, wherein the plurality of layers configuring the circuit layer further include a second conductive layer that is used as the other electrode at an opposite position to the conductive layer in a case where the conductive layer is used as one electrode of a capacitor in the display region, and
   the second conductive layer is positioned at the same layer as the first gate electrode of the first staggered thin film transistor, and is located below the second staggered thin film transistor.

6. The display device according to claim 1, wherein the plurality of thin film transistors provided in the display region further include a first staggered thin film transistor at a position of the same layer as the first staggered thin film transistor of the peripheral region.

7. A display device comprising:
   a plurality of pixel electrodes that are provided in a display region;
   a common electrode above the plurality of pixel electrodes;

a light-emitting element layer between the plurality of pixel electrodes and the common electrode; and a circuit layer including a plurality of layers in the display region and a peripheral region which is outside of the display region, wherein the circuit layer includes a first thin film transistor in the peripheral region and a second thin film transistor in the display region, the first thin film transistor has a first channel layer configured of low-temperature polysilicon, the first channel layer is not positioned between a first drain electrode and a first gate electrode, the first channel layer is not positioned between a first source electrode and the first gate electrode, the first source electrode is connected with a first contact plug, the first drain electrode is connected with a second contact plug, the second thin film transistor has a second channel layer configured of an oxide semiconductor, the second channel layer is not positioned between a second drain electrode and a second gate electrode, the second channel layer is not positioned between a second source electrode and the second gate electrode, and, the second channel layer is positioned higher than the first channel layer, a first height between a top of the first contact plug and the first channel layer is larger than a second height between a top surface of the second source electrode and the second channel layer, and the circuit layer further includes a metal layer that is formed of the same material at a position of the same layer as the second gate electrode and overlaps at least an end portion of the first channel layer.

8. The display device according to claim 7, wherein the circuit layer includes a first conductive layer having ionized low-temperature polysilicon layer in the display region, and the first conductive layer and the first channel layer include same material, and the first conductive layer is located lower than the second channel layer.

9. The display device according to claim 8, wherein the first conductive layer is overlapped with the second channel layer.

10. The display device according to claim 8, wherein the circuit layer further includes a second conductive layer facing the first conductive layer, and the second conductive layer is lower than the second channel layer.

11. The display device according to claim 7, wherein the plurality of thin film transistors provided in the display region further includes a third thin film transistor having a third channel layer, wherein the third channel layer has the same composition as the first channel layer.

12. The display device according to claim 7, wherein the metal layer is contacted with the first contact plug.

* * * * *